(12) United States Patent
Pan et al.

(10) Patent No.: US 10,581,223 B2
(45) Date of Patent: Mar. 3, 2020

(54) STRUCTURE AND FABRICATING METHOD OF DISTRIBUTED FEEDBACK LASER

(71) Applicant: TRUELIGHT CORPORATION, Hsinchu (TW)

(72) Inventors: Chien Hung Pan, Hualien County (TW); Cheng Zu Wu, Hsinchu County (TW)

(73) Assignee: TrueLight Corporation (TW)

( * ) Notice: Subject to any disclaimer, the term of this patent is extended or adjusted under 35 U.S.C. 154(b) by 0 days.

(21) Appl. No.: 15/922,611

(22) Filed: Mar. 15, 2018

(65) Prior Publication Data

US 2019/0115717 A1    Apr. 18, 2019

(51) Int. Cl.
| | |
|---|---|
| *H01S 5/12* | (2006.01) |
| *H01S 5/026* | (2006.01) |
| *H01S 5/02* | (2006.01) |
| *H01S 5/028* | (2006.01) |
| *H01S 5/22* | (2006.01) |

(52) U.S. Cl.
CPC .......... *H01S 5/1203* (2013.01); *H01S 5/0206* (2013.01); *H01S 5/028* (2013.01); *H01S 5/0268* (2013.01); *H01S 5/1225* (2013.01); *H01S 5/1228* (2013.01); *H01S 5/0287* (2013.01); *H01S 5/124* (2013.01); *H01S 5/22* (2013.01)

(58) Field of Classification Search
CPC ................................................ H01S 5/12–125
See application file for complete search history.

(56) References Cited

U.S. PATENT DOCUMENTS

| | | | | |
|---|---|---|---|---|
| 5,111,475 A | * | 5/1992 | Ackerman | H04B 10/58 372/50.11 |
| 5,875,274 A | * | 2/1999 | Stein | G02B 6/4212 372/50.1 |
| 6,638,773 B1 | * | 10/2003 | Hwang | H01S 5/1082 438/2 |
| 9,071,038 B2 | * | 6/2015 | Evans | H01S 5/1209 |
| 9,742,151 B1 | * | 8/2017 | Botez | H01S 5/3402 |
| 9,768,585 B2 | * | 9/2017 | Zheng | H01S 5/06256 |
| 2002/0048300 A1 | * | 4/2002 | Tsukiji | H01S 5/227 372/50.11 |

(Continued)

FOREIGN PATENT DOCUMENTS

| | | | | |
|---|---|---|---|---|
| EP | 0847116 A2 | * | 6/1998 | ............. G02B 6/124 |
| KR | 20130067010 A | * | 6/2013 | ......... H01S 5/06258 |
| WO | WO-2007066916 A1 | * | 6/2007 | ............. B82Y 20/00 |

*Primary Examiner* — Joshua King

(57) ABSTRACT

A structure of distributed feedback (DFB) laser includes a grating layer having a phase-shift grating structure and a gratingless area. In addition, both side-surfaces of the DFB laser are coated with anti-reflection coating to improve SMSR and to obtain good slope efficiency (SE). The grating layer is divided by the phase-shift grating structure in a horizontal direction into a first grating area and a second grating area adjacent to a laser-out surface of the DFB laser. The phase-shift grating structure provides a phase-difference distance, such that a shift of phase exists between the micro-grating structures located within the first grating area and the other micro-grating structures located within the second grating area. The gratingless area located within the second grating area contains no micro-grating structure, and moreover, the gratingless area will not change the phase of the micro-grating structures located within the second grating area.

4 Claims, 11 Drawing Sheets

(56) References Cited

U.S. PATENT DOCUMENTS

| | | | |
|---|---|---|---|
| 2002/0061047 A1* | 5/2002 | Fish | B82Y 20/00 372/102 |
| 2002/0064203 A1* | 5/2002 | Pezeshki | H01S 5/06258 372/64 |
| 2002/0154665 A1* | 10/2002 | Funabashi | H01S 5/125 372/45.01 |
| 2004/0001522 A1* | 1/2004 | Mori | H01S 5/12 372/50.11 |
| 2004/0099859 A1* | 5/2004 | Nakahara | B82Y 20/00 257/14 |
| 2005/0276298 A1* | 12/2005 | Fischer | B82Y 20/00 372/50.1 |
| 2005/0276302 A1* | 12/2005 | Okunuki | H01S 5/1228 372/98 |
| 2006/0104321 A1* | 5/2006 | He | H01S 5/0265 372/26 |
| 2006/0209911 A1* | 9/2006 | Takabayashi | H01S 5/06256 372/20 |
| 2007/0263694 A1* | 11/2007 | Fujii | H01S 5/0612 372/102 |
| 2008/0112445 A1* | 5/2008 | Anselm | H01S 5/12 372/26 |
| 2008/0205476 A1* | 8/2008 | Kanskar | B82Y 20/00 372/96 |
| 2008/0225918 A1* | 9/2008 | Achtenhagen | H01S 5/12 372/44.01 |
| 2010/0272133 A1* | 10/2010 | Kato | H01S 5/06256 372/20 |
| 2011/0134955 A1* | 6/2011 | Kitamura | B82Y 20/00 372/50.11 |
| 2016/0049770 A1* | 2/2016 | Frez | H01S 5/3401 372/45.01 |
| 2017/0170631 A1* | 6/2017 | Chimot | H01S 5/06258 |
| 2018/0076596 A1* | 3/2018 | Ishiura | H01S 5/1215 |

* cited by examiner

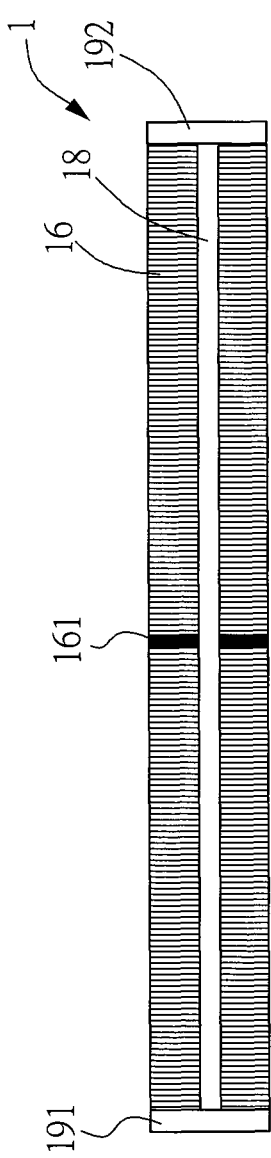
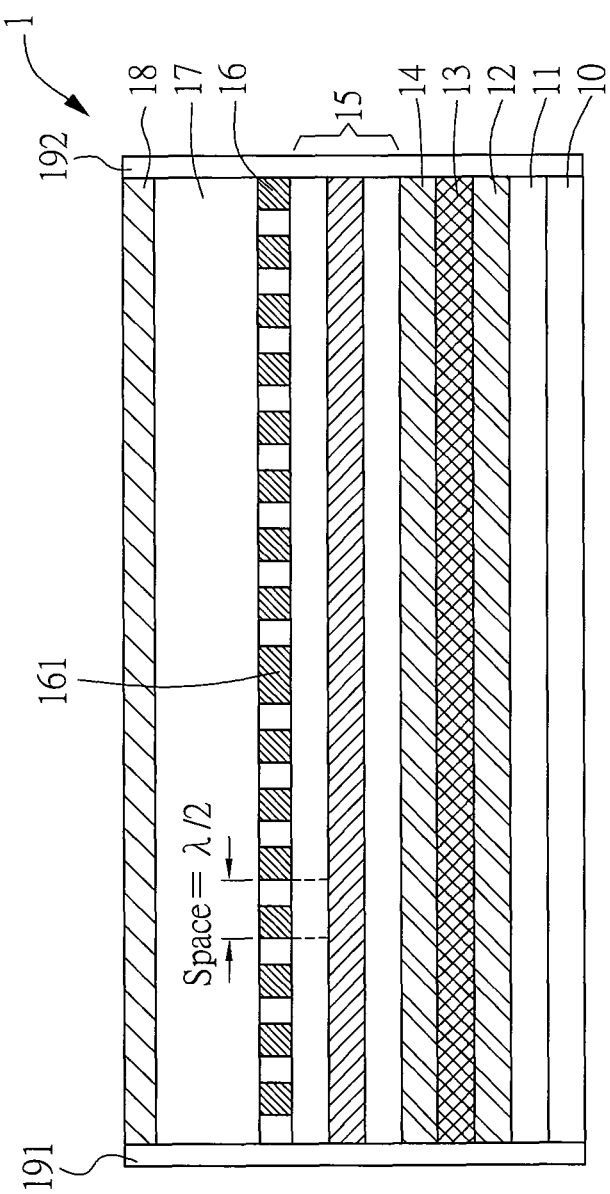
FIG.1A (PRIOR ART)
FIG.1B (PRIOR ART)

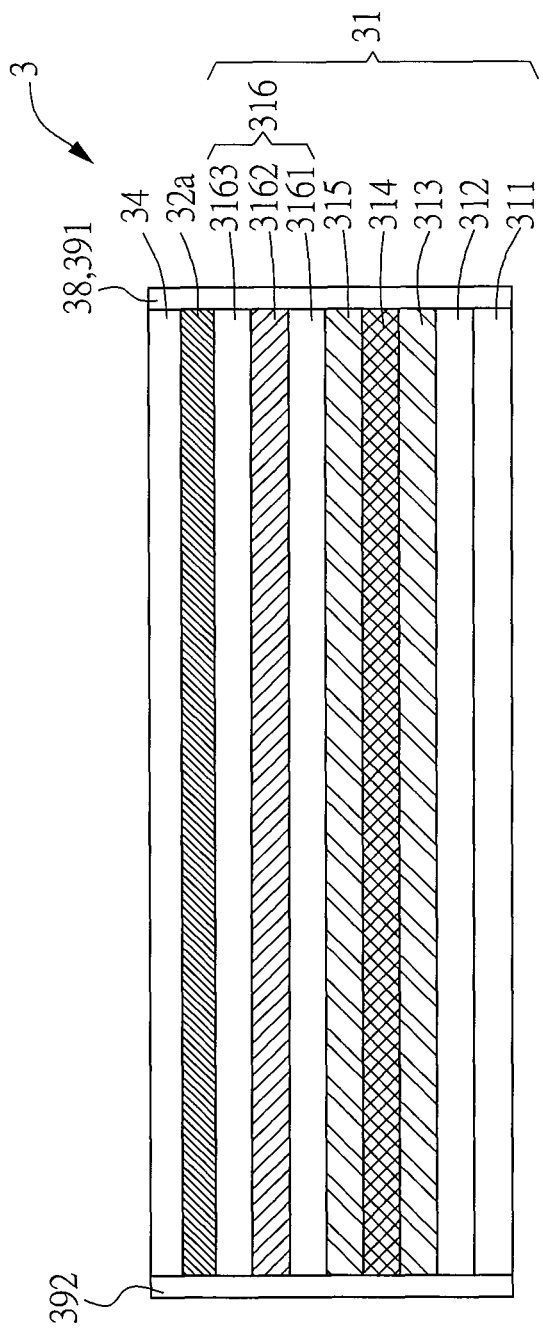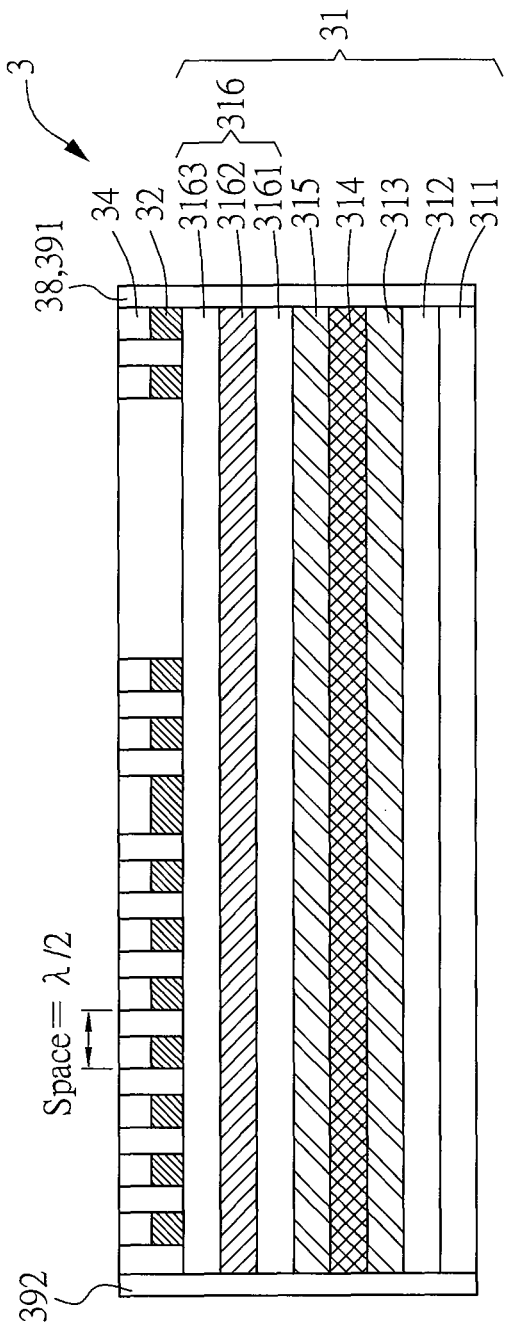

STRUCTURE AND FABRICATING METHOD OF DISTRIBUTED FEEDBACK LASER

This application claims the benefit of Taiwan Patent Application Serial No. 106135518, filed on Oct. 17, 2017, the subject matter of which is incorporated herein by reference.

BACKGROUND OF INVENTION

1. Field of the Invention

The invention relates to a distributed feedback laser structure and a fabricating method thereof, and more particularly to the structure and the fabricating method that provide a phase-shift grating structure and a gratingless area to a grating layer of the distributed feedback laser and anti-reflection coating to both lateral sides of the distributed feedback laser.

2. Description of the Prior Art

Conventionally, the semiconductor laser, or called as the laser diode, is featured in small volume, low power consumption, quick response, well impact resistance, long service life, high efficiency, low price and so on. Thereupon, the semiconductor laser is widely applied to products for electrooptical systems, such as lightwave communications, information systems, household appliances, precision measurements, optical fiber communications and so on. In particular, in the optical fiber communications, since the distributed feedback (DFB) laser is featured in simple manufacturing, mono-mode output, long-distance transmission and so on, the laser signal generated by the DFB laser can still maintain an acceptable signal/noise ratio even after experiencing long-distance transmission. Hence, the FEB laser has become one of popular light sources for modern lightwave communications and optical fiber communication system.

Nevertheless, the side mode suppression ratio (SMSR) is usually applied as a flag related to the yield of the DFB lasers. Ideally, in order to get rid of disadvantages of side modes, a phase-shift grating design is introduced to a middle portion of the ridge, and also the to mirrors at both sides of the DFB laser would have respective anti-reflection (AR) coating with reflectivity <1%. Referring to FIG. 1A and FIG. 1B, top and front views of a typical conventional distributed feedback laser are shown, respectively. The structure 1 of the conventional distributed feedback laser includes, in an ascending order, a substrate 10, a lower cladding layer 11, a lower SCH (SCH) layer 12, an active region layer 13, an upper SCH layer 14, a spacer layer 15, a grating layer 16, an upper cladding layer 17 and a contact layer 18, in which the upper cladding layer 17 and the contact layer 18 are integrated to form a ridge structure. In addition, the grating layer 16 includes a phase-shift grating structure 161, and thus a phase difference would exist between micro-grating structures at the right side and the left side of the phase-shift grating structure 161. Accordingly, the mirrors 191, 192 at two opposing ends of the FEB laser are furnished with respective AR coating with reflectivity <1%. Such a resort may ideally avoid any hurt to the SMSR yield, but the laser energy would be outputted from both ends of the DFB laser due to the existence of AR coating at the opposing mirrors. However, due that the laser energy is dispersedly distributed, the slope efficiency (SE) at each end of the DFB laser can be only up to about 0.25 mW/mA. Such a small SE cannot meet definitely requirements of super high-speed Gigabit passive optical networks (G-PON) or Ethernet passive optical networks (E-PON). Hence, another improvement is recently provided to the conventional distributed feedback laser 1a by applying an AR mirror 192 to the front power-output plane and a mirror 191 with a high-reflection coating (HR mirror) to the rear power-output plane, in which the HR mirror 191 has a reflectivity 60~90%, and, in addition, by arranging the phase-shift grating structure 161 to be adjacent to the HR mirror 191, as shown in FIG. 2A and FIG. 2B. Thereupon, the front power-output plane (i.e., the AR mirror 192) can provide an SE larger than 0.4 mW/mA, which can fairly meet most of practical requirements. However, this improvement still has its own shortcomings. For example, in the case that the spectrum of the HR or the AR is not well controlled, lasing would occur easily to the Fabry-Perot (FP) laser mode under low temperatures. In addition, according to the existing splitting technique for laser chip bars, it is hard to arrange a split surface right at the grating. Thus, a random phase problem to the end having the HR mirror 192 would be inevitable. Such an outcome would induce sparse distributions to the threshold currents ($I_{th}$) and SE of the chip-to-chip or the bar-to-bar. Also, in some particular phases, the situation of two equal-strength lasing modes may be met, and thus the SMSR yield would be reduced. In other words, further improvement is necessary.

SUMMARY OF THE INVENTION

Accordingly, it is the primary object of the present invention to provide a distributed feedback laser structure that can improve the SMSM yield in producing the distributed feedback laser structure and provide better slope efficiency (SE) by introducing a phase-shift grating structure and a gratingless area to a grating layer of the distributed feedback laser and by providing anti-reflection coating (AR) to both lateral sides of the distributed feedback laser.

In the present invention, the distributed feedback laser structure, applicable to generate a laser beam with a laser wavelength, includes:

a semiconductor-laminated structure, generating the laser beam with the laser wavelength upon receiving an electric current, emitting the laser beam from a laser-out surface located at a lateral side thereof;

a grating layer, located on the semiconductor-laminated structure, including a plurality of micro-grating structures arranged in a horizontal direction, the plurality of micro-grating structures being separated to each other largely by spacing equal to one half of the laser wavelength; and, a ridge structure, located on the grating layer;

wherein the grating layer includes, in the horizontal direction, a first grating area, a phase-shift grating structure, a second grating area and a gratingless area, the laser-out surface is adjacent to the second grating area, the phase-shift grating structure is located at a junction area of the first grating area and the second grating area, a width of the phase-shift grating structure provide a phase-difference distance between the micro-grating structures in the first grating area and the micro-grating structures in the second grating area, and the gratingless area containing no said micro-grating structure is located in the second grating area.

In one embodiment of the present invention, the phase-difference distance provided by the phase-shift grating structure is equal to one quarter of the laser wavelength, a width of the gratingless area is at least larger than 10 times of the laser wavelength, and the width of the gratingless area is an integer multiple of one half of the laser wavelength, such that a phase of the micro-grating structures in the second grating area is kept no change.

In one embodiment of the present invention, a width of the first grating area is larger than or equal to one third of a total width of the grating layer, a width of the second grating area containing the gratingless area is no larger than two third of the total width of the grating layer, and the width of the gratingless area is less than or equal to one third of the total width of the grating layer. Preferably, the width of the second grating area containing the gratingless area is equal to or larger than the width of the first grating area.

In one preferred embodiment of the present invention, the phase-shift grating structure is located adjacent to a middle portion of the grating layer in the horizontal direction, so that a width of the first grating area is approximately equal to a width of the second grating area containing the gratingless area.

In one preferred embodiment of the present invention, both the width of the first grating area and the width of the second grating area containing the gratingless area are approximately equal to one half of the total width of the grating layer, and the width of the gratingless area is within one sixth to one third of the total width of the grating layer.

In one embodiment of the present invention, the grating layer with the total width has a coupling strength κL within 2~5, the first grating area has a first coupling strength, the second grating area excluding the gratingless area has a second coupling strength, the gratingless area has a third coupling strength, the first coupling strength is larger than the second coupling strength, the second coupling strength is larger than the third coupling strength, and the third coupling strength is equal to 0.

In one embodiment of the present invention, the semiconductor-laminated structure includes:
a semiconductor substrate;
a lower cladding layer, located on the semiconductor substrate;
a separated confinement hetero-structure (SCH) layer, located on the lower cladding layer;
an active region layer, located on the lower SCH layer;
an upper SCH layer, located on the active region layer; and,
a spacer layer, located on the upper SCH layer;
wherein the grating layer is located on the spacer layer;
wherein the ridge structure, located on the grating layer, further includes an upper cladding layer on the grating layer and a contact layer on the upper cladding layer.

In one embodiment of the present invention, the semiconductor-laminated structure further includes:
a first anti-reflection coating (AR), located on the laser-out surface at the lateral side of the semiconductor-laminated structure; and,
a second AR, located to another lateral side of the semiconductor-laminated structure by opposing to the laser-out surface;
wherein an optical reflectivity of the first AR and the second AR is lower than 1%.

In another aspect of the present invention, the method for fabricating a distributed feedback laser includes the following steps.

Step (A): Apply a semiconductor epitaxy process to form a semiconductor-laminated structure on a semiconductor substrate, the semiconductor-laminated structure generating a laser beam with a laser wavelength upon receiving an electric current, the semiconductor-laminated structure emitting the laser beam from a laser-out surface located at a lateral side of the semiconductor-laminated structure.

Step (B): Apply e-beam writer and nano imprint processes to form a grating layer on the semiconductor-laminated structure, the grating layer including a plurality of micro-grating structures arranged a horizontal direction, the plurality of micro-grating structures being separated from each other by spacing largely equal to one half of the laser wavelength.

Step (C): Apply a semiconductor epitaxy process and a yellow-light process to form a ridge structure on the grating layer.

In this method, the grating layer includes, in the horizontal direction, a first grating area, a phase-shift grating structure, a second grating area and a gratingless area, the laser-out surface is adjacent to the second grating area, the phase-shift grating structure is located at a junction area of the first grating area and the second grating area, a width of the phase-shift grating structure provide a phase-difference distance between the micro-grating structures in the first grating area and the micro-grating structures in the second grating area, and the gratingless area containing no said micro-grating structure is located in the second grating area.

All these objects are achieved by the distributed feedback laser structure and the fabricating method thereof described below.

BRIEF DESCRIPTION OF THE DRAWINGS

The present invention will now be specified with reference to its preferred embodiment illustrated in the drawings, in which:

FIG. 1A and FIG. 1B are schematic top and front views of a conventional distributed feedback laser, respectively;

FIG. 7A to FIG. 7D demonstrate schematically and orderly different steps of the fabricating method of the distributed feedback laser in accordance with the present invention.

DESCRIPTION OF THE PREFERRED EMBODIMENT

The invention disclosed herein is directed to a distributed feedback laser structure and a fabricating method thereof. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 3A:
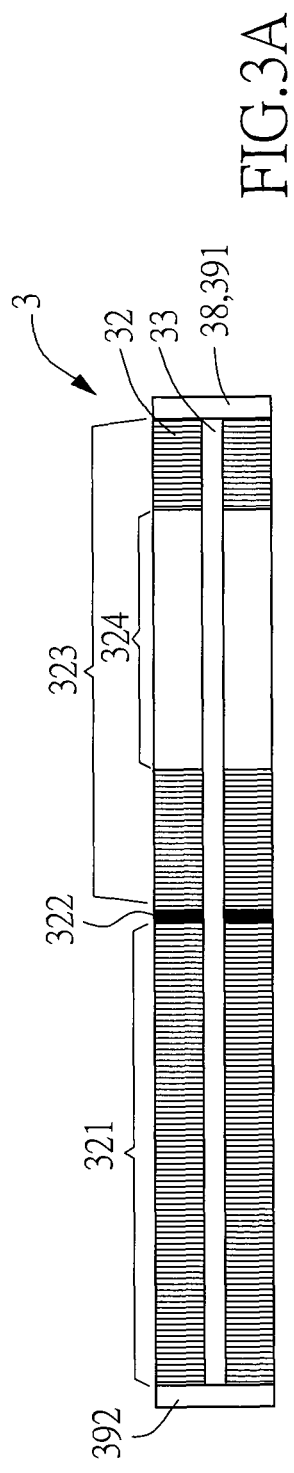
FIG. 3A and FIG. 3B are schematic top and front views of an embodiment of the distributed feedback laser structure in accordance with the present invention, respectively.
Figure 3B:
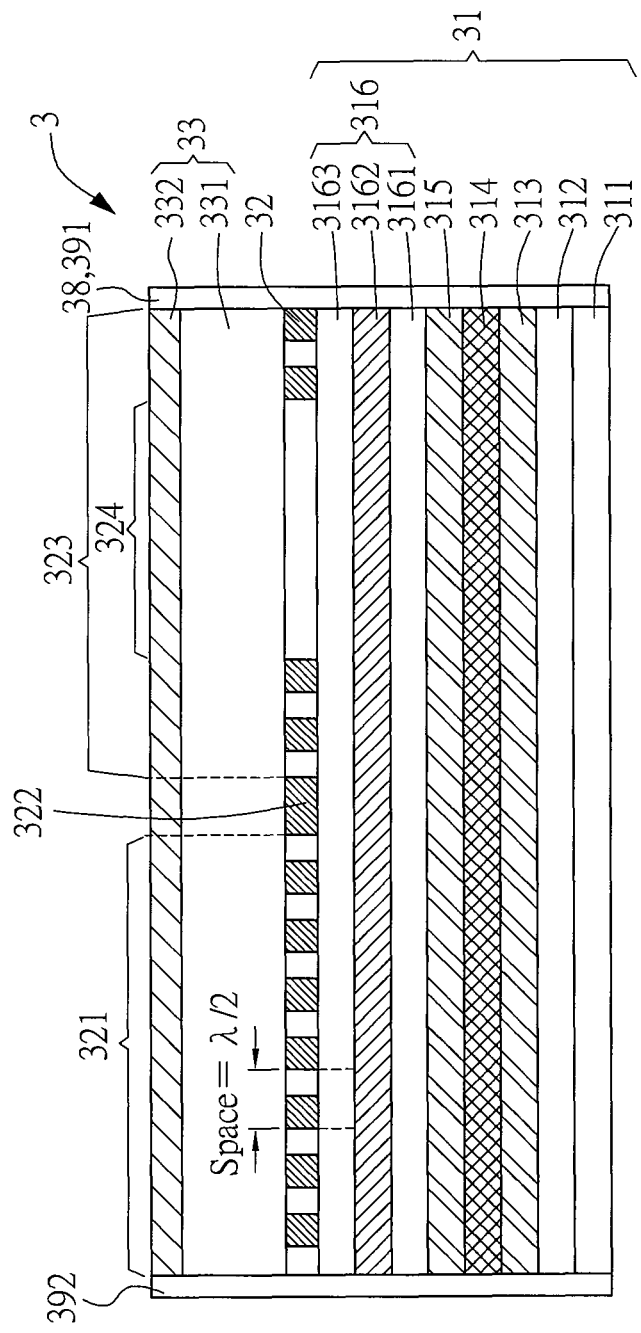

Referring now to FIG. 3A and FIG. 3B, top and front views of an embodiment of the distributed feedback laser (DFB laser) structure are shown, respectively. In this embodiment, the DFB laser structure 3 largely includes a semiconductor-laminated structure 31, a grating layer 32 and a ridge structure 33.

The semiconductor-laminated structure 31 can generate a laser beam with a laser wavelength λ, as an electric current is received. The laser beam is emitted from a laser-out surface 38 of the semiconductor-laminated structure 31. The laser-out surface 38 is located to a lateral side of the semiconductor-laminated structure 3, and thus the semiconductor-laminated structure 3 can fulfill the structuring of a typical edge-emitting laser diode. The semiconductor-laminated structure 31 of the present invention includes a semiconductor substrate 311, a lower cladding layer 312 located on the semiconductor substrate 311, a lower separated confinement hetero-structured (SCH) layer 313 located on the lower cladding layer 312, an active region layer 314 located on the lower SCH layer 313, an upper SCH 315 located on the active region layer 314, a spacer layer 316 located on the upper SCH layer 315, a first anti-reflection coating (AR) 391 and a second AR 392. As shown, the grating layer 32 is located on the spacer layer 316, and the ridge structure 33 is located on the grating layer 32. The ridge structure 33 further includes an upper cladding layer 331 located right on the grating layer 32 and a contact layer 332 located on the upper cladding layer 331. In this embodiment, the spacer layer 316 further includes an InP inter layer 3161 located on the upper SCH layer 315, an etching stop layer 3162 located on the InP inter layer 3161, and an InP spacer layer 3163 located on the etching stop layer 3162. The first AR 391 is located on the laser-out surface 38 at a lateral side of the semiconductor-laminated structure 3, while the second AR 392 is located on the laser-out surface 38 at another lateral side of the semiconductor-laminated structure 3. In this embodiment, another applicable range of optical reflectivity for both the first AR 391 and the second AR 392 is lower than 1%, preferably (but not limited to) about 0.1%.

According to general operation theory of the edge-emitting laser diode, carriers of electrons and electric holes would be injected into the active region layer, and confined in quantum well layer by a carrier barrier layer, such that corresponding material gains would be generated through composite lighting. The confinement theory is that, since the carrier barrier layer has a higher material energy gap than the quantum well layer does, a lower quantum energy level would be formed at the quantum wells. As long as the carriers are captured by the corresponding quantum wells, then it is hard for the carries to escape. Thereupon, a laser optical field would be confined, by the upper and lower cladding layers, in a long and narrow resonant chamber formed by the upper SCH layer, the lower SCH layer and the active region layer. According to the confinement theory, the refractive index n of the upper and lower cladding layers is lower than that of the upper SCH layer, the lower SCH layer and the active region layer. Thus, according to the total-reflection theory, the optical field would induce a mode in the material having a higher n value, and then propagate. The coupling degree between the optical field and the quantum wells in the active region layer determines the modal gain. A higher modal gain would be easier to overcome the optical loss, such that the lasing can be achieved. Also, the threshold current for lasing would be lowered easily as well.

In one embodiment of the present invention, the semiconductor substrate 311 can be an InP substrate. By epitaxy processes, the lower cladding layer 312, the lower SCH layer 313, the active region layer 314, the upper SCH layer 315 and the spacer layer 316 are formed orderly on the InP substrate 311. The InP substrate 311, the lower cladding layer 312 and the lower SCH layer 313 all have n-typed doping while the upper cladding layer 331 and the contact layer 332 both has p-typed doping. The lower cladding layer 312 and the upper cladding layer 331 are made of InP. The active region layer 314 can be made of $In_{1-x-y}Al_xGa_yAs$, in which x and y are both real numbers within 0~1. The contact layer 332 can be made of InGaAs. Both the lower SCH layer 313 and the upper SCH layer 315 can be made of $In_{1-z}Al_zAs$, in which z is a real number within 0~1. Since material compositions, structural thicknesses, doping concentrations and other parameters for layers of the semiconductor-laminated structure of the present invention can be selected from those for the conventional distributed feedback laser and are not characteristics of the present invention, thus details thereabout are omitted herein. In addition, the material compositions, the structural thicknesses, the doping concentrations and the other parameters for individual layers of the semiconductor-laminated structure of the present invention are not limited to the aforesaid embodiment.

In this embodiment, the grating layer 32, located on the InP spacer layer 3163 in the spacer layer 316 of the semiconductor-laminated structure 31, includes a plurality of micro-grating structures arranged in a horizontal direction. Spacing between neighboring micro-grating structures is largely equal to the laser wavelength λ, or one half of the laser wavelength λ (i. e., λ/2). In this embodiment, the spacing for the plurality of micro-grating structures is equal to one half of the laser wavelength λ. Practically, the laser wavelength λ is the wavelength in the waveguide, equivalently equal to $\lambda_0/n_{eff}$, in which $\lambda_0$ is the vacuum wavelength, and $n_{eff}$ is an equivalent refractive index of the semiconductor waveguide. In this embodiment, the grating layer 32 includes, in the horizontal direction, a first grating area 321, a phase-shift grating structure 322, a second grating area 323, and a gratingless area 324. The laser-out surface 38 is adjacent to the second grating area 323. The phase-shift grating structure 322, located at a junction area of the first grating area 321 and the second grating area 323, has a width to provide a phase-difference distance to the micro-grating structures in the first grating area 321 and those in the second grating area 323. In addition, the gratingless area 324, located in the second grating area 323, contains no micro-grating structure.

In this embodiment, the phase-difference distance provided by the phase-shift grating structure 322 is one quarter of the laser wavelength (i.e., λ/4-shift). In addition, the gratingless area 324 has a width at least larger than 10 times of the laser wavelength λ, but the width thereof is an integer multiple of one half of the laser wavelength (n×λ/2). Thus, the phase of the micro-grating structure in the second grating area 323 won't be varied. Namely, though a majority of the micro-grating structures in the second grating area 323 would be divided into a left portion and a right portion by the gratingless area 324, yet the phases of the micro-grating structures at these two portions are all the same. In other words, even facing the existence of the gratingless area 324, no phase shift occurs to any micro-grating structure in the second grating area 323. In an exemplary embodiment of the present, the width of the first grating area 321 is larger than or equal to one third of a total width of the grating layer 32 in the horizontal direction, and the width of the second grating area 323 containing the gratingless area 324 is no larger than two third of the total width of the grating layer 32. Also, the width of the gratingless area 324 is less than or equal to one third of the total width of the grating layer 32. In the preferred embodiment of the present invention (for example, the structure shown in FIG. 3A and FIG. 3B), the phase-shift grating structure 322 is located adjacent to a middle portion of the grating layer 32 in the horizontal direction, such that the width of the first grating area 321 can be approximately the same as that of the second grating area 323 containing the gratingless area 324. Namely, both the width of the first grating area 321 and the width of the second grating area 323 containing the gratingless area 324 are approximately equal to one half of the total width of the grating layer 32. In addition, the applicable width of the gratingless area 323 is within ⅙~⅓ the total width of the grating layer 32. Preferably, the width of the gratingless area 323 can be, but not limited to, about one quarter of the total width of the grating layer 32. In the embodiment shown in FIG. 3A and FIG. 3B, the total width of the grating layer is about 250 μm, the width of the first grating area 321 is about 125 μm, the width of the second grating area 321 containing the gratingless area 324 is about 125 μm, and the width of the gratingless area 324 is about 62 μm. In addition, the gratingless area 324 is located at a place to divide a plurality of micro-grating structures of the second grating area 321 into two portions, where the portion adjacent to the phase-shift grating structure 322 has a width of about 1 μm, while another portion adjacent to the laser-out surface has a width of about 62 μm. Definitely, the aforesaid limitation on widths is only one of various exemplary examples, and is not to limit the scope of the present invention.

In this embodiment, the entire grating layer has a coupling strength κL for the total width; in which κ is Kappa, and L is the total width of the grating layer. In particular, the first grating area 321 has a first coupling strength $κL_1$, in which $L_1$ is the width of the first grating area 321; and, similar to the other portion of the grating layer 32. The area of the second grating area 323 other than the gratingless area 324 has a second coupling strength $κL_2$, and the gratingless area 324 has a third coupling strength $κL_3$. The applicable coupling strength κL of the whole grating layer having the total width is within 2~5. The first coupling strength is larger than the second coupling strength, and the second coupling strength is larger than the third coupling strength. In the preferred embodiment shown in FIG. 3A and FIG. 3B, the coupling strength κL of the grating layer with the total width can be but not limited to, about 3.5, and the third coupling strength is equal to 0. Definitely, the aforesaid limitation on the coupling strengths is only one of various exemplary examples, and is not to limit the scope of the present invention.

Figure 2A:
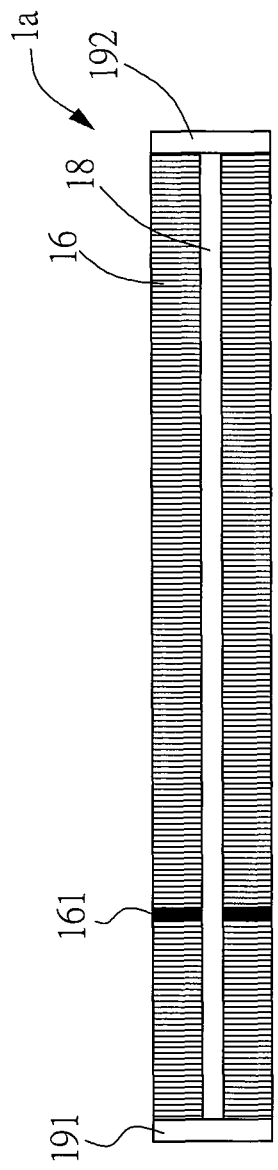
FIG. 2A and FIG. 2B are schematic top and front views of another conventional distributed feedback laser, respectively.
Figure 2B:
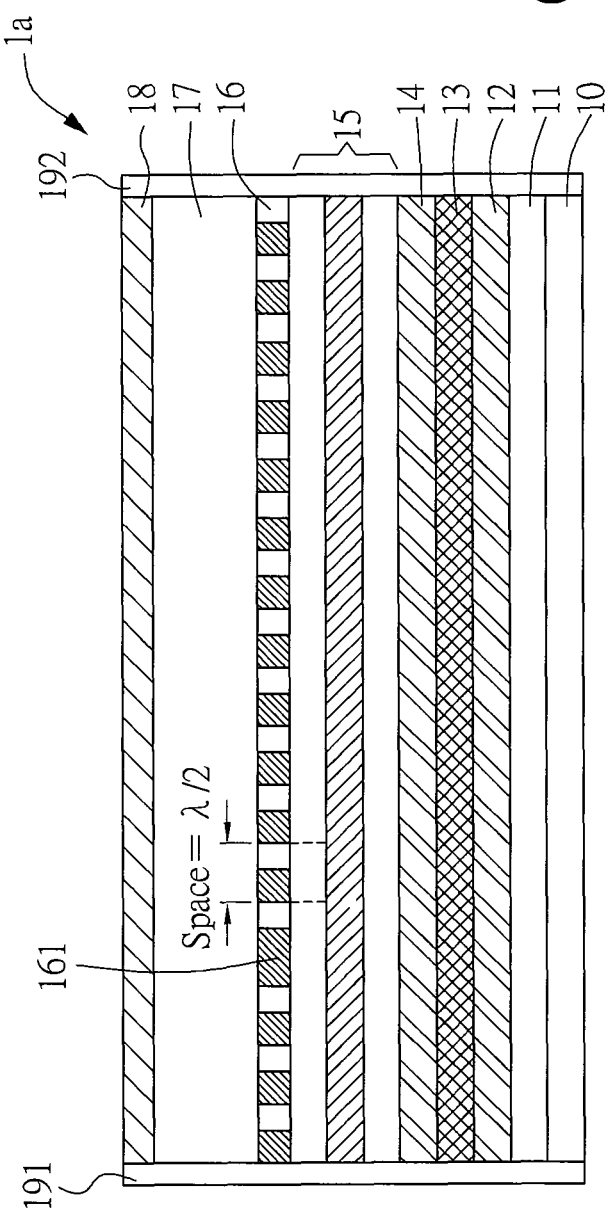
Figure 4A:
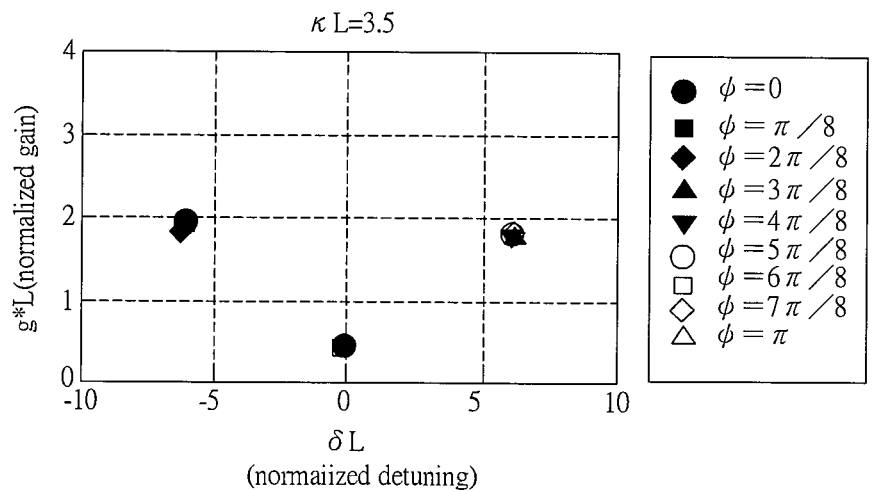
FIG. 4A to FIG. 4C show computer-simulated results of normalized gains (g*L) with respect to corresponding normalized detuning (δL), optical selectivity (Δ(g1-g2)) with respect to corresponding normalized gains (g*L), and SE ratios (AR/HR) with respect to corresponding normalized gains (g*L), respectively, according to the conventional distributed feedback laser of FIG. 1B, in which different labels stand for different phases so as thereby to observe easily random phasing caused by mirror splitting.
Figure 4B:
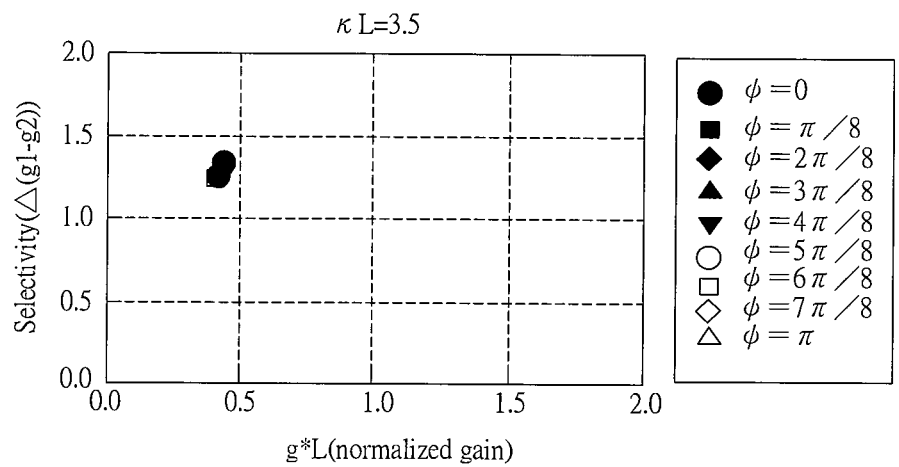
Figure 4C:
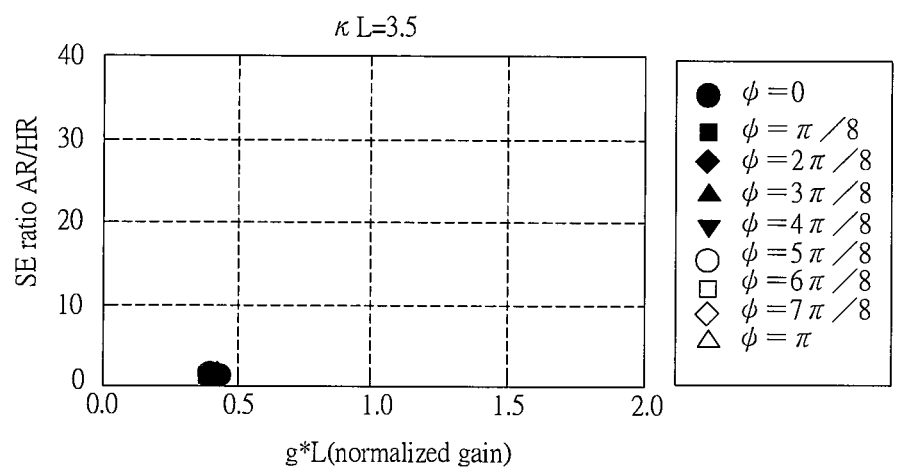
Figure 5A:
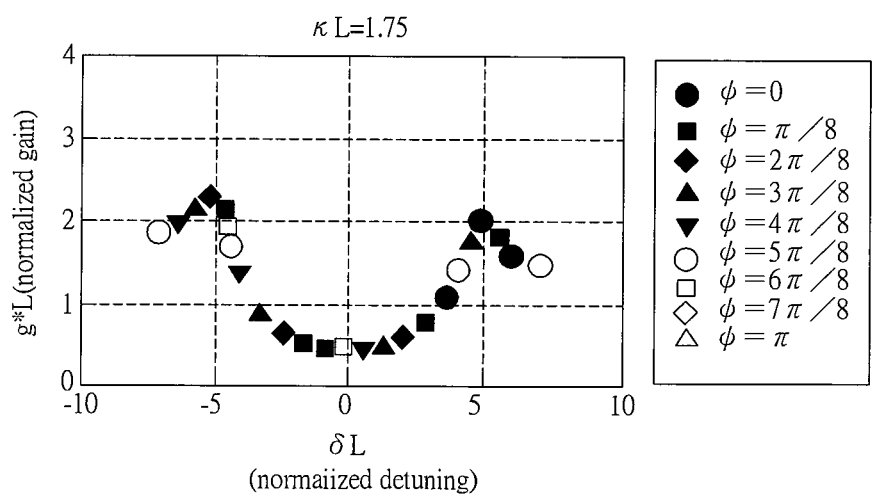
FIG. 5A to FIG. 5C show computer-simulated results of normalized gains (g*L) with respect to corresponding normalized detuning (δL), optical selectivity (Δ(g1-g2)) with respect to corresponding normalized gains (g*L), and SE ratios (AR/HR) with respect to corresponding normalized gains (g*L), respectively, according to the conventional distributed feedback laser of FIG. 2B, in which different labels stand for different phases so as thereby to observe easily random phasing caused by mirror splitting.
Figure 5B:
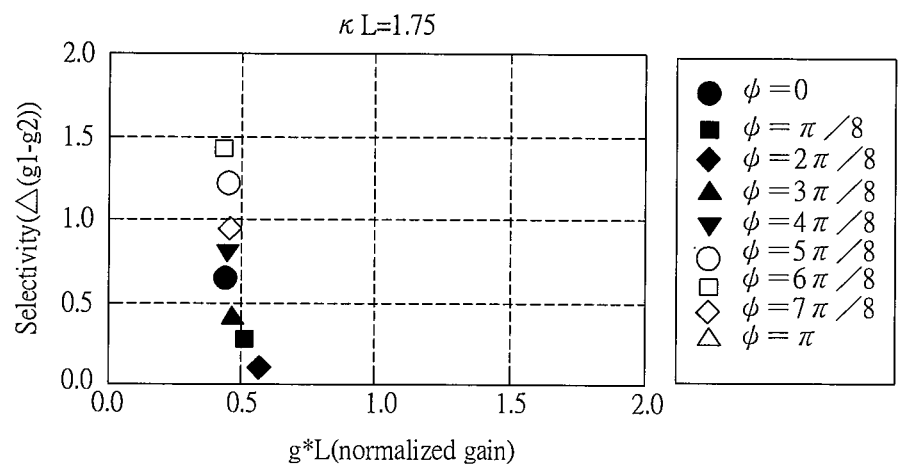
Figure 5C:
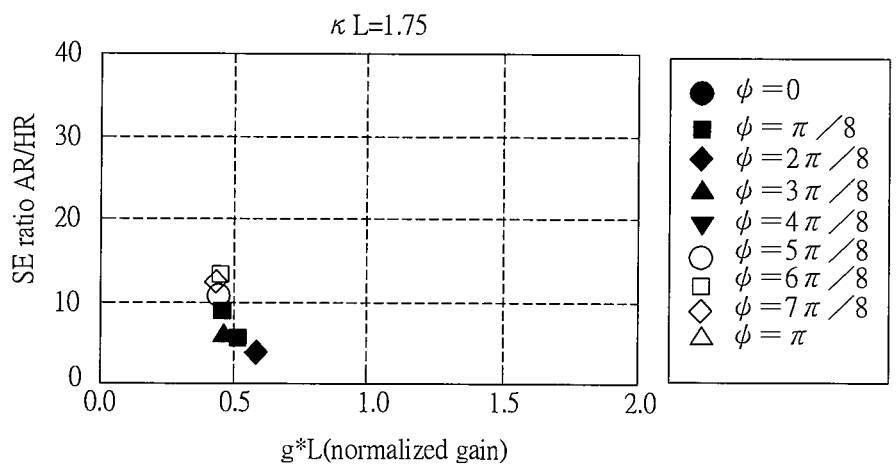
Figure 6A:
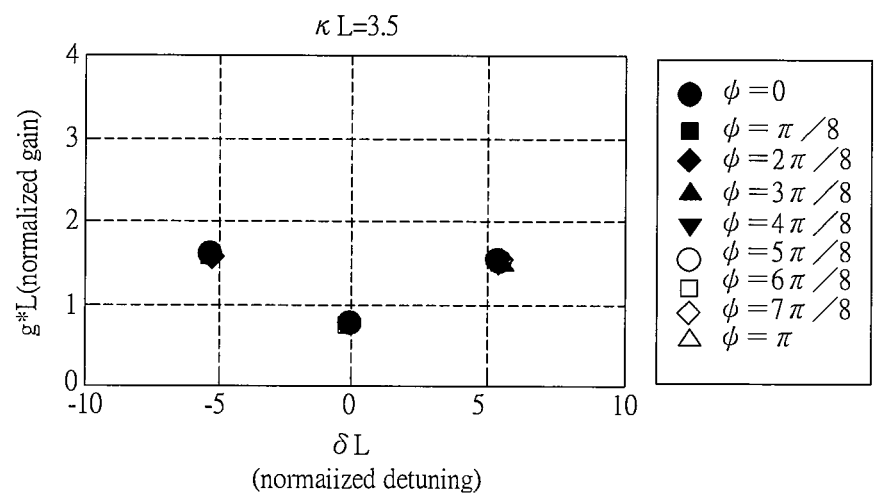
FIG. 6A to FIG. 6C show computer-simulated results of normalized gains (g*L) with respect to corresponding normalized detuning (δL), optical selectivity (Δ(g1-g2)) with respect to corresponding normalized gains (g*L), and SE ratios (AR/HR) with respect to corresponding normalized gains (g*L), respectively, according to the distributed feedback laser structure of FIG. 3B, in which different labels stand for different phases so as thereby to observe easily random phasing caused by mirror splitting.

In the computer simulations upon the distributed feedback lasers, embodiments thereof shown in FIG. 1B, FIG. 2B and FIG. 3B are involved. Computations of the simulations adopt the method of transfer matrix, and the calculation equations and processes can be referred to "Semiconductor Laser Technology" (Chinese edition), Tin-Chun Lu and Hsin-Tzong Wang, Wu-Nan Publications. Through matrix manipulations, laser detunes (δ) and the corresponding gains (g) for lasing (lasing) for each mode of the distributed feedback laser can be obtained. Herein, a main mode has the smallest gain g, a side mode has the second smallest gain g, and the difference of the aforesaid two g's is the so-called optical selectivity (or selectivity) related to the SMSR. The higher the selectivity is, the better the SMSR would be. Simulation results according to the equations and criteria provided by the aforesaid reference are presented in FIG. 4A to FIG. 4C, FIG. 5A to FIG. 5C, and FIG. 6A to FIG. 6C; in which FIG. 4A to FIG. 4C show computer-simulated results of normalized gains (g*L) with respect to corresponding normalized detuning (δL), optical selectivity (Δ(g1-g2)) with respect to corresponding normalized gains (g*L), and SE ratios (AR/HR) with respect to corresponding normalized gains (g*L), respectively, according to the conventional distributed feedback laser of FIG. 1B, in which different labels stand for different phases so as thereby to observe easily random phasing caused by mirror splitting; FIG. 5A to FIG. 5C show computer-simulated results of normalized gains (g*L) with respect to corresponding normalized detuning (δL), optical selectivity (Δ(g1-g2)) with respect to corresponding normalized gains (g*L), and SE ratios (AR/HR) with respect to corresponding normalized gains (g*L), respectively, according to the conventional distributed feedback laser of FIG. 2B, in which different labels stand for different phases so as thereby to observe easily random phasing caused by mirror splitting; and, FIG. 6A to FIG. 6C show computer-simulated results of normalized gains (g*L) with respect to corresponding normalized detuning (δL), optical selectivity (Δ(g1-g2)) with respect to corresponding normalized gains (g*L), and SE ratios (AR/HR) with respect to corresponding normalized gains (g*L), respectively, according to the distributed feedback laser structure of FIG. 3B, in which different labels stand for different phases so as thereby to observe easily random phasing caused by mirror splitting.

Figure 6B:
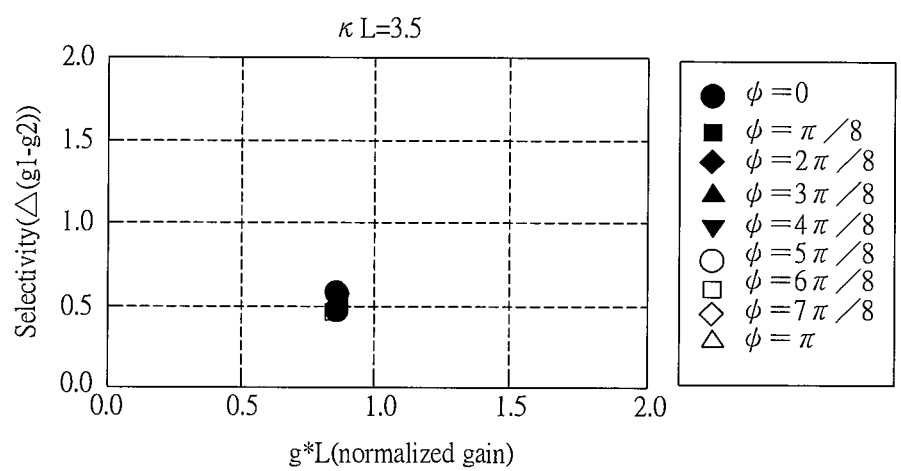
Figure 6C:
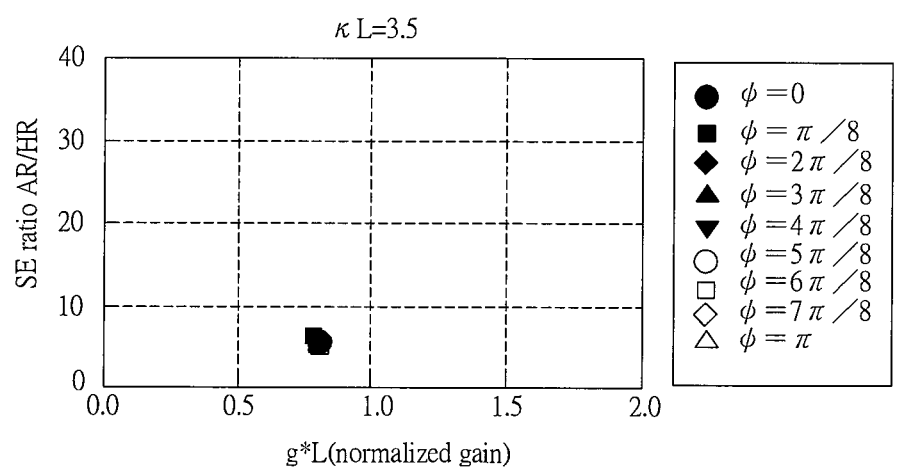

From FIG. 6B and FIG. 6C, it is found that the selectivities of the distributed feedback laser of FIG. 3B in accordance with the present invention are clustered within 0.5~0.7, the normalized gains thereof are within 0.8~0.9, and the SE ratios thereof are within 7~8. On the other hand, in FIG. 4B and FIG. 4C for the conventional distributed feedback laser of FIG. 1B, the selectivities thereof are clustered within 1.3~1.4, the normalized gains thereof are all around 0.4, and the SE ratios thereof are all less than 1. In addition, in FIG. 5B and FIG. 5C for the conventional distributed feedback laser of FIG. 2B, the selectivities thereof are distributed in broader area within 0~1.5, the normalized gains thereof are within 0.4~0.6, and the SE ratios thereof are also broadly distributed within 3~12. By comparing the aforesaid simulation results, it is proved that the distributed feedback laser of the present invention can provide better selectivity and emitting light energy of the front optical surface, so that the whole yield can be raised, and the aforesaid shortcomings of the art can be substantially resolved.

Referring now to FIG. 7A to FIG. 7D, different steps of the fabricating method of the distributed feedback laser in accordance with the present invention are demonstrated schematically and orderly. In this preferred embodiment, the method for fabricating the distributed feedback laser includes the following steps.

Step (A): As shown in FIG. 7A, through the metal organic chemical vapor deposition (MOCVD) or other conventional semiconductor epitaxy processes, a semiconductor-laminated structure, a grating layer 32a and a protective layer 34 can be orderly formed on a semiconductor substrate. The semiconductor-laminated structure can generate a laser beam with a specific laser wavelength upon receiving an electric current, and then the laser beam would be emitted out of the semiconductor-laminated structure through a laser-out surface located at a lateral side of the semiconductor-laminated structure. The semiconductor-laminated structure includes, in an ascending order, a semiconductor substrate 311, a lower cladding layer 312, a lower SCH layer 313, an active region layer 314, an upper SCH layer 315 and a spacer layer 316. In particular, the spacer layer 316 further includes, in an ascending order, an InP inter layer 3161, an etching stop layer 3162, and an InP spacer layer 3163.

Step (B): As shown in FIG. 7B, through e-beam writer and nano imprint processes, a plurality of micro-grating structures arranged in a horizontal direction can be formed at the grating layer 32 on the InP spacer layer 3163 of the semiconductor-laminated structure. These micro-grating structures are spaced to each other largely by spacing equal to the laser wavelength or one half of the laser wavelength. In the horizontal direction, the grating layer 32 includes a first grating area, a phase-shift grating structure, a second grating area and a gratingless area. The aforesaid laser-out surface is adjacent to the second grating area. The phase-shift grating structure is located at the junction area of the first grating area and the second grating area. In addition, the width of the phase-shift grating structure can provide a phase-difference distance between the micro-grating structures in the first grating area and those in the second grating area. Also, the gratingless area is located in the second grating area, and contains no micro-grating structure.

Figure 7C:
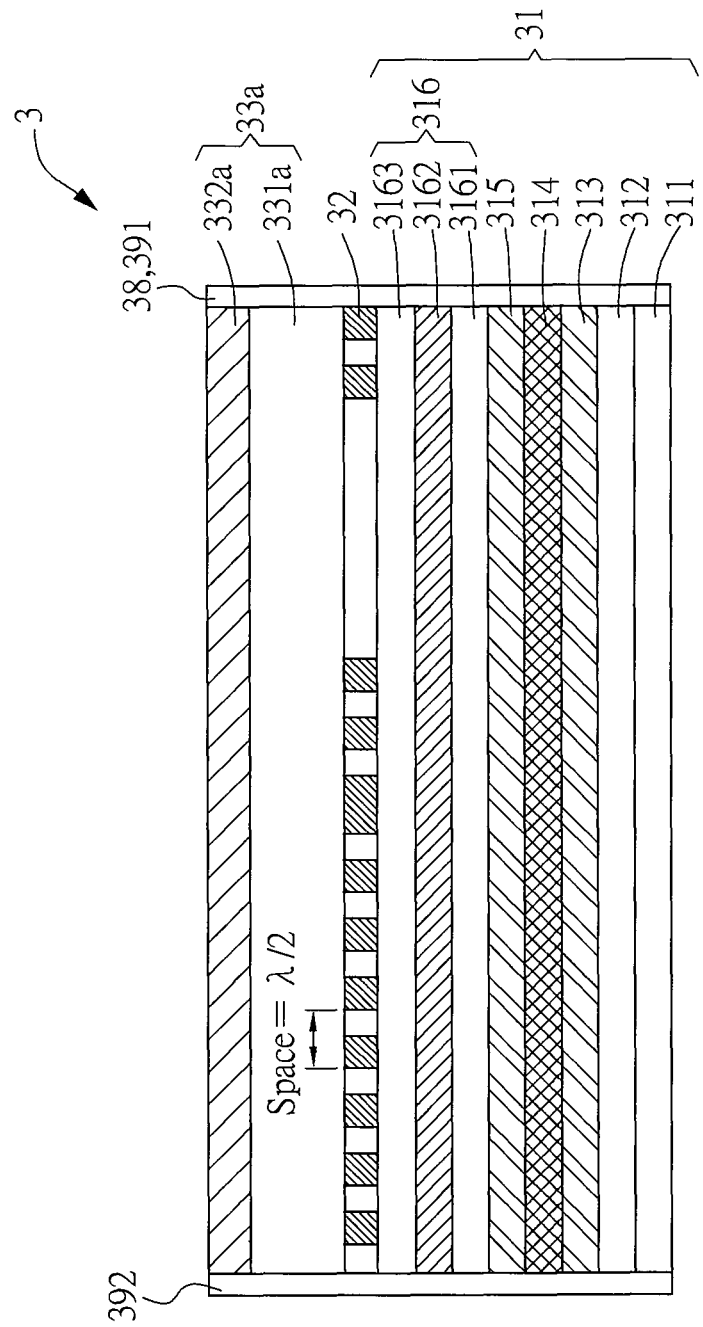

Then, as shown in FIG. 7C, an epitaxy process is further applied to form orderly an upper cladding layer 331a and a contact layer 332a on the grating layer 32, so that a ridge structure 33a can be formed lately.

Figure 7D:
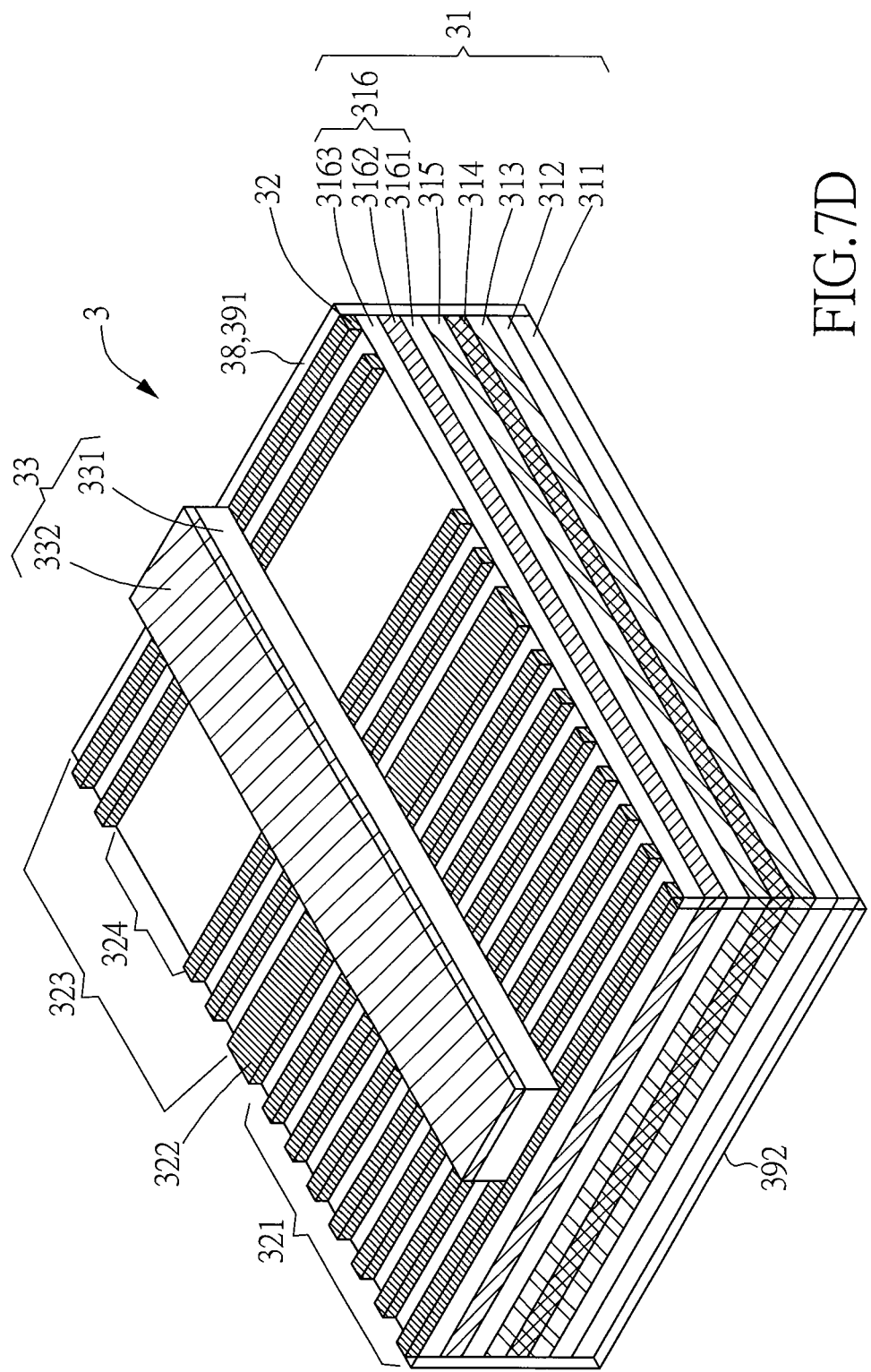

Step (C): As shown in FIG. 7D, by applying a conventional laser yellow-light process upon the upper cladding layer 331a and contact layer 332a, the ridge structure 33a can be formed on the grating layer 32.

While the present invention has been particularly shown and described with reference to a preferred embodiment, it will be understood by those skilled in the art that various changes in form and detail may be without departing from the spirit and scope of the present invention.

What is claimed is:

1. A distributed feedback laser structure, applicable to generate a laser beam with a laser wavelength, comprising:
   a semiconductor-laminated structure, generating the laser beam with the laser wavelength upon receiving an electric current, emitting the laser beam from a laser-out surface located at a lateral side thereof;
   a grating layer, located on the semiconductor-laminated structure, including a plurality of micro-grating structures arranged in a horizontal direction, the plurality of micro-grating structures being separated to each other largely by spacing equal to one half of the laser wavelength; and,
   a ridge structure, located on the grating layer;

wherein the grating layer includes, in the horizontal direction, a first grating area, a phase-shift grating structure, a second grating area and a gratingless area, the laser-out surface is adjacent to the second grating area, the phase-shift grating structure is located at a junction area of the first grating area and the second grating area, a width of the phase-shift grating structure provide a phase-difference distance between the micro-grating structures in the first grating area and the micro-grating structures in the second grating area, and the gratingless area containing no said micro-grating structure is located in the second grating area;
   wherein the number of said gratingless area is exactly one; said exactly one gratingless area is only located in the second grating area, and there is no said gratingless area in the first grating area;
   wherein the phase-difference distance provided by the phase-shift grating structure is equal to one quarter of the laser wavelength, and the width of the gratingless area is an integer multiple of one half of the laser wavelength, such that a phase of the micro-grating structures in the second grating area is kept constant;
   wherein both the width of the first grating area and the width of the second grating area containing the gratingless area are approximately equal to one half of the total width of the grating layer, and the width of the gratingless area is within one sixth to one third of the total width of the grating layer and is at least larger than 10 times of the laser wavelength.

2. The distributed feedback laser structure of claim 1, wherein the grating layer with the total width has a coupling strength κL within 2~5, the first grating area has a first coupling strength, the second grating area excluding the gratingless area has a second coupling strength, the gratingless area has a coupling strength of 0, the first coupling strength is larger than the second coupling strength, the second coupling strength is larger than 0.

3. The distributed feedback laser structure of claim 1, wherein the semiconductor-laminated structure includes:
   a semiconductor substrate;
   a lower cladding layer, located on the semiconductor substrate;
   a separated confinement hetero-structure (SCH) layer, located on the lower cladding layer;
   an active region layer, located on the lower SCH layer;
   an upper SCH layer, located on the active region layer; and,
   a spacer layer, located on the upper SCH layer;
   wherein the grating layer is located on the spacer layer;
   wherein the ridge structure, located on the grating layer, further includes an upper cladding layer on the grating layer and a contact layer on the upper cladding layer.

4. The distributed feedback laser structure of claim 3, wherein the semiconductor-laminated structure further includes:
   a first anti-reflection coating (AR), located on the laser-out surface at the lateral side of the semiconductor-laminated structure; and,
   a second AR, located to another lateral side of the semiconductor-laminated structure by opposing to the laser-out surface;
   wherein an optical reflectivity of the first AR and the second AR is lower than 1%.

* * * * *